(12) United States Patent
Yamaguchi (10) Patent No.: US 7,368,018 B2
(45) Date of Patent: May 6, 2008

(54) CHEMICAL VAPOR DEPOSITION APPARATUS

(75) Inventor: Eiichi Yamaguchi, Tokyo (JP)

(73) Assignee: Powdec K.K., Kanagawa (JP)

( * ) Notice: Subject to any disclaimer, the term of this patent is extended or adjusted under 35 U.S.C. 154(b) by 103 days.

(21) Appl. No.: 10/486,866

(22) PCT Filed: Jul. 24, 2002

(86) PCT No.: PCT/JP02/07482

§ 371 (c)(1),
(2), (4) Date: Mar. 23, 2004

(87) PCT Pub. No.: WO03/017345

PCT Pub. Date: Feb. 27, 2003

(65) Prior Publication Data

US 2004/0211365 A1    Oct. 28, 2004

(30) Foreign Application Priority Data

Aug. 14, 2001   (JP) .............................. 2001-246177

(51) Int. Cl.
  C23C 16/00    (2006.01)
  C23F 1/00     (2006.01)
  H01L 21/306   (2006.01)
(52) U.S. Cl. ................... 118/730; 156/345.55
(58) Field of Classification Search ................ 118/730; 156/345.55
  See application file for complete search history.

(56) References Cited

U.S. PATENT DOCUMENTS

| 3,707,868 | A | * | 1/1973 | Fruit ........................... 73/1.61 |
| 5,685,039 | A | * | 11/1997 | Hamada et al. ............... 15/88.2 |
| 5,782,979 | A | * | 7/1998 | Kaneno et al. .............. 118/500 |
| 5,788,777 | A | * | 8/1998 | Burk, Jr. ...................... 118/730 |
| 6,449,428 | B2 | * | 9/2002 | Aschner et al. ............. 392/418 |
| 6,569,250 | B2 | * | 5/2003 | Paisley et al. .............. 118/730 |
| 6,733,591 | B2 | * | 5/2004 | Anderson .................... 118/715 |
| 2001/0047762 | A1 | * | 12/2001 | Hayashi ....................... 118/728 |
| 2002/0083899 | A1 | * | 7/2002 | Komeno et al. ............ 118/730 |

FOREIGN PATENT DOCUMENTS

| JP | 02-288665 | | 11/1990 |
| JP | 04-094719 | | 3/1992 |
| JP | 08213329 A | * | 8/1996 |
| JP | 11-012085 | | 1/1999 |
| JP | 11-067670 | | 3/1999 |
| JP | 2000-012470 | | 1/2000 |
| JP | 2002-175992 | | 6/2002 |
| WO | WO 2000/36635 | * | 6/2000 |

* cited by examiner

*Primary Examiner*—Parviz Hassanzadeh
*Assistant Examiner*—Rakesh K Dhingra
(74) *Attorney, Agent, or Firm*—Bell, Boyd & Lloyd LLP

(57) ABSTRACT

A chemical vapor deposition apparatus is provided. The chemical vapor deposition apparatus includes a susceptor support base and a susceptor, and configured to rotate the susceptor with a rotary shaft, a gap as wide as about 1 mm or more is provided along the boundary between the support base and the perimeter of the susceptor to prevent Ga from forming bridges between the support base and the susceptor during growth of III-V compound semiconductors such as GaN, thereby preventing disturbance of rotation.

2 Claims, 6 Drawing Sheets

Fig. 1

PRIOR ART

Fig. 2

PRIOR ART

GRAVITY

CHEMICAL VAPOR DEPOSITION APPARATUS

CROSS REFERENCES TO RELATED APPLICATIONS

The present application claims priority to Japanese Patent Document No. P2001-246177 filed on Aug. 14, 2001, the disclosure of which is herein incorporated by reference.

BACKGROUND OF THE INVENTION

This invention relates to a chemical vapor deposition apparatus, especially suitable for application to a metal organic chemical vapor deposition (MOCVD) apparatus.

Devices manufactured by using III-V compound semiconductors, such as light emitting devices including LEDs and semiconductor lasers, and other devices like communication-purpose high-frequency transistors, are important devices constituting hardware infrastructures of the modern communication society, together with silicon (Si)-based devices.

III-V compound semiconductor devices, having structures ingeniously making use of hetero junctions of III-V compound semiconductors, take a complementary part with Si-based devices in regions impossible to realize with Si.

For manufacturing compound semiconductor devices including III-V compound semiconductors, excluding simple-structured devices such as MESFET, hetero epitaxial techniques are important techniques. It is no exaggeration to say that hetero epitaxial techniques basically support the manufacture of such devices. Molecular beam epitaxy and chemical vapor deposition, in particular MOCVD, are currently major hetero epitaxial techniques, which have been studied in laboratories since 1960s.

MOCVD was bought into practice as an epitaxial growth technique for manufacturing GaAs semiconductor lasers. Currently, an MOCVD apparatus enabling epitaxial growth on a number of substrates simultaneously is commercially available. In terms of componential techniques of the multi-substrate MOCVD apparatus, there are various types. Regarding the susceptor configuration, there are a barrel type and a pancake type. In terms of the gas flow mode, there are a high-flow-rate horizontal type, high-revolution type, vertical down-flow type, and so on. In terms of the substrate-supporting mode, there are schemes of putting substrates above the gas flow (face-down) or putting substrates under the gas flow (face-up). Regarding heating there are a RF induction heating type, electrical resistance heating type, lamp heating type, and so on. These componential techniques are combined variously to make up various types of MOCVD apparatuses.

Conventional MOCVD apparatuses for epitaxial growth of III-V compound semiconductors uses gallium (Ga), aluminum (Al) or indium (In) as a group III element and arsenic (As) or phosphorus (P) as a group V element, and the growth temperature was 800° C. at most. On the other hand, there is a recent demand for an MOCVD apparatus capable of epitaxially growing GaN compound semiconductors using ammonia ($NH_3$) as a source material.

A MOCVD apparatus for GaN semiconductors is configured to invite reaction of a group III organic metal compound and ammonia ($NH_3$) at a temperature around 1100° C. to grow a single-crystal thin film on a sapphire or SiC substrate. Concerning the single-crystal thin film, gas composition and growth conditions for growing high quality crystals were academically reported and known. However, MOCVD apparatuses for realizing optimized gas composition and growth conditions for obtaining high quality crystals have been modified after individual technical researches, and almost none of their actual improvements are known. Among some known MOCVD apparatuses, there are some proposals directed to the structure of the reaction tube (for example, Japanese Patent Laid-open Publications Nos. JP-H02-288665A, JP-H04-94719 A and JP-H11-12085). Even with these techniques, it has been difficult to manufacture semiconductors of long-lasting good crystal qualities under acceptable reproducibility because of various entangled factors.

SUMMARY OF THE INVENTION

The present invention generally relates to a chemical vapor deposition apparatus, particularly a metal organic chemical vapor deposition (MOCVD). The present invention provides a chemical vapor deposition apparatus optimized for obtaining quality high crystals by epitaxial growth of compound semiconductors, and especially GaN compound semiconductors.

The Inventor continued vigorous studies to overcome the above-discussed problems involved in the prior art techniques. The contents of the studies are introduced hereunder.

Figure 1:
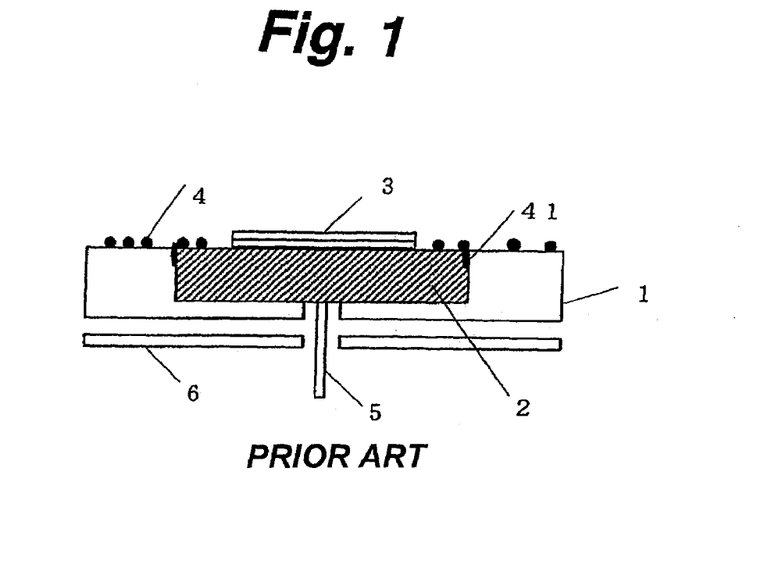
FIG. 1 is a cross-sectional view showing the substantial part of a conventional chemical vapor deposition apparatus.

A chemical vapor deposition apparatus typically includes a susceptor, and a support base holding the susceptor, as shown in FIG. 1. The susceptor is designed to rotate on its own axis relative to the support base. In FIG. 1, reference numeral 1 denotes the support base, 2 is the susceptor, 3 is a substrate, 5 is a rotation axis for rotation of the susceptor, and 6 is a heater. The heater 6 is put in the support base 1 in some designs. The support base 1 may be configured to rotate in some designs. Rotation of the susceptor 2 enhances the uniformity of thickness of the film deposited on the substrate 3.

After repeated use of the apparatus, decomposition products accumulate as sediments 4 on the susceptor 2 and the support base 1, and sediments 4 accumulating along the boundary between the support base 1 and the susceptor 2 under relative movements disturbs the rotational movements. It has been recognized that a serious problem occurs especially when growing gallium nitride semiconductors. For growth of a gallium nitride semiconductor, the substrate surface is cleaned with a flow of hydrogen for 10 minutes at 1100° C., for example. In this hot cleaning process, nitrides accumulated on the susceptor 2 in the preceding manufacturing process decompose, and metallic gallium remains in form of small droplets on the surface. Liquid gallium near the boundary between the susceptor 2 and the support base 1 makes small balls by surface tension, and invites bridging at the boundary between the susceptor 2 and the support base 1. When ammonia gas is supplied for the next growth step, liquid metallic gallium nitridized, and solid of gallium nitride again grows along the boundary as shown by numeral 41. The GaN solid having intruded into the boundary seriously disturbs rotation of the susceptor 2, and may ultimately cause mechanical destruction. Therefore, it will be effective to separate the susceptor 2 and the support base 1 by a distance wide enough to prevent formation of bridges by metallic gallium.

The support base including the susceptor may be configured to incline from the upstream to the downstream of the gas flow to increase the flow rate of the gas. This will contributes to uniforming the film in thickness. In vapor deposition of nitrides, however, accumulated nitrides may cause the above-explained undesirable problem following the process of changing to liquid metallic gallium, moving along the inclined surface into the gap between the susceptor and the support base, making bridges of metallic gallium therebetween, and forming the solid in the next step supplying ammonia. Therefore, to prevent this phenomenon, it will be effective to make grooves of ridges and furrows on the support base and thereby block the flow of metallic gallium droplets beyond the grooves.

Figure 2:
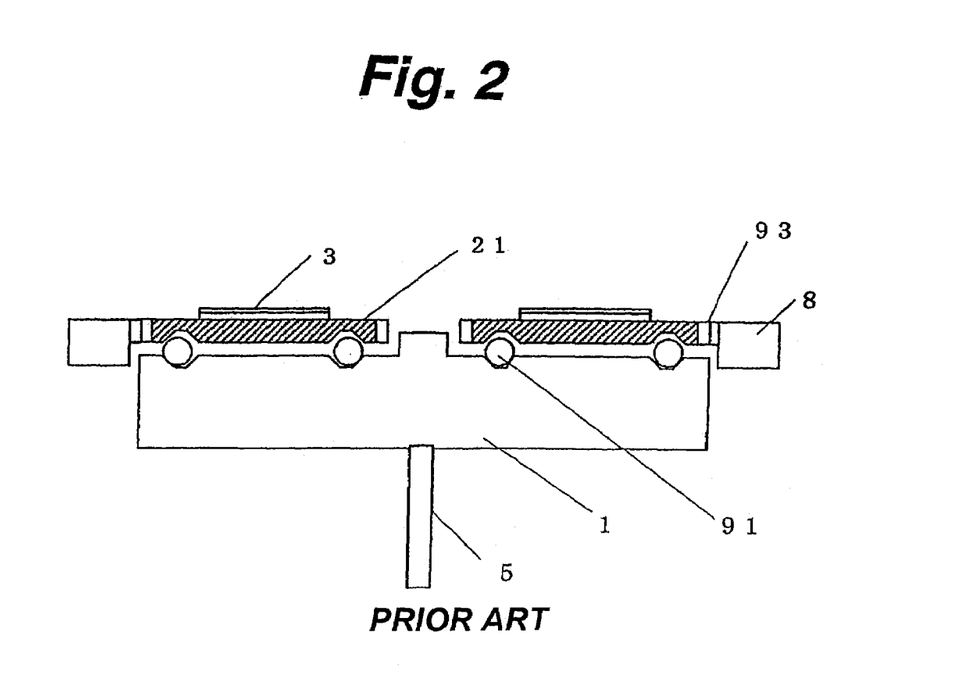
FIG. 2 is a cross-sectional view showing the substantial part of another conventional chemical vapor deposition apparatus.

Known techniques use the mechanism as show in FIG. 2 to rotate the susceptor 2, in which the support base 1 and susceptors 21 have formed annular grooves equal in diameter and hold carbon balls 91 in the grooves. Gears 93 are formed at end portions of the susceptors 21 and driven by external stationary gears 8 to realize rotational movements reduced in friction. However, since the susceptors 21 and the support base 1 are not integral, the susceptors 21 may jump and disengage under vibrations when the rotation speed increases. Especially in a growth apparatus for growth of nitride compound semiconductors at high temperatures, in which SiC-based materials having rough surfaces are often used, improvement of the susceptor structure has been longed for. Therefore, it will be effective to provide an independent bearing mechanism between each susceptor 21 and the support base 1.

There is a type of mechanism for rotating the susceptor, which cannot rotate the center axis of the susceptor directly. A typical way for coping with it uses a gear on the circumference of the susceptor to drive the gear with an external gear. In this case, however, if the temperature is raised high for growth like the growth apparatus of nitride semiconductors, it is necessary to cope with the problem of relative positional offset by thermal expansion and the problem of an increase of the frictional force. Therefore, if new system is employed, which includes a mechanism located on the circumference of one ring of susceptors or bearings to resist against wind pressure and an inlet tube introducing a gas flow into the mechanism, it is possible to prevent irregular torque by slipping. Thus, the new system is effective against destruction of rotating members by relative positional offset and against an increase of the frictional force.

As a way of heating the susceptor, there is a lamp-heated system that have actually been employed in a nitride compound semiconductor growth apparatus of a normal pressure type (Japanese Patent Laid-open Publication No. JP-H11-12085A). Among apparatuses of a reduced pressure type, there are only a few examples using a heating lamp. Especially among growth apparatuses for nitride compound semiconductors, no apparatuses have heretofore employed lamp-heated systems. However, this is made possible by employing a system in which the lamp house itself forms a part of the depressurizing container.

Figure 3:
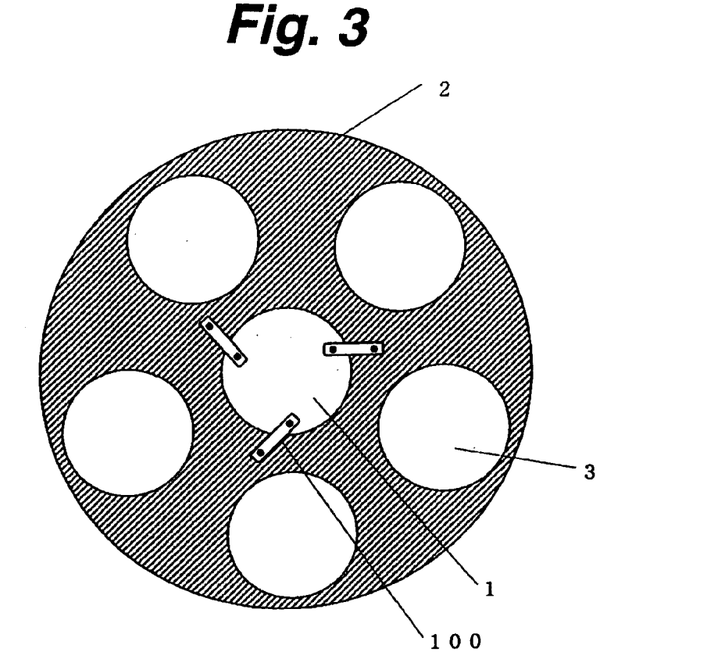
FIG. 3 is a plan view showing a particular part of still another conventional chemical vapor deposition apparatus and a corresponding part of a chemical vapor deposition apparatus according to an embodiment of the present invention.
Figure 4:
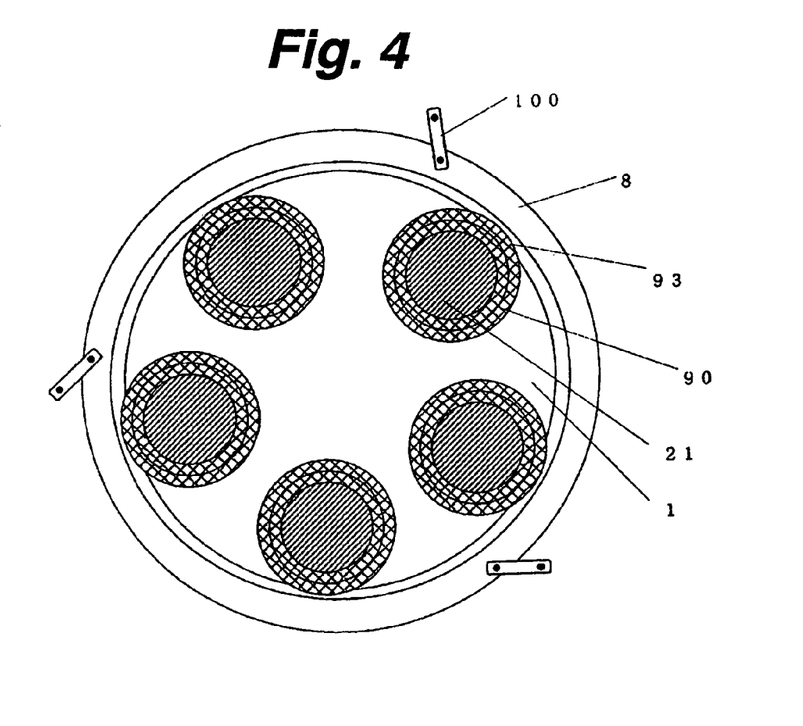
FIG. 4 is a plan view showing a particular part of yet another conventional chemical vapor deposition apparatus and a corresponding part of a chemical vapor deposition apparatus according to an embodiment of the present invention.

With regard to a mechanism for rotating a large-scaled rotational susceptor or support base, some apparatuses employ a system not holding the center axis of rotation. For example, as shown in FIG. 3, in case a donut-shaped carbon susceptor 2 is located to encircle the support base 1 made of a rotatable quartz disk having a center axis, and the donut-type carbon susceptor 2 alone is heated, it is impossible to integrally fix the support base 1 and the susceptor 2 because the support base 1 made of quarts and the susceptor 2 made of carbon are different in thermal expansion coefficient. Therefore, their relative positions vary with temperature. In another configuration as shown in FIG. 4, in which a plurality of susceptors 21 attached on a large rotatable support base 1 having a center axis of rotation is rotated both about its own axis and together with the support base 1 by a stationary gear 8 located to encircle the them together, the stationary gear 8 around them must be isotropically expanded (contracted) in response to the thermal expansion (contraction) of the rotational support base 1 while maintaining it center stationary when the temperature rises (or decreases). If not, gears will fail to bite properly and will break ultimately. Reaction apparatuses such as growth apparatuses for nitride compound semiconductors, which are required to work at growth temperatures as high as 1100° C., are subjected to large thermal expansion. Therefore, unless the outer-circumferential stationary gear 8 is expanded while keeping its center axis stationary, the outer-circumferential stationary gear 8 cannot engage accurately with the gears 90 of the susceptors 21 attached on the rotatable disk, and will become unable to drive the susceptors 21. Therefore, it is indispensable to use a structure for maintaining the center point at a constant position upon isotropic deformation like thermal expansion of a member whose center cannot be fixed physically. As a structure for this purpose, it is useful to provide connection rods at some positions on the member having rotation symmetry to extend equally in length and equally in angle from diametric lines passing their positions, and to connect the opposite ends of the connection rods to a member independent from the member having rotation symmetry. Thus, the center point of the member is maintained constant even upon isotropic deformation thereof.

For immediately stopping a drive mechanism (motor) in the rotating system for driving the center axis directly upon any extraordinary friction on the part of the rotating member, a slip mechanism was typically used heretofore between the drive mechanism and the rotation axis. This system certainly stops the rotating member by slipping. However, it is impossible to know the occurrence of the extraordinary phenomenon at that moment. Taking it into account, it is effective to develop this mechanism by introducing a rotary encoder between the rotational member and a slipping member or a torsionally deformable member to know any irregularity by processing the rotation output of the rotary encoder and the rotation output from the drive mechanism with a comparator and an information processing device, so as to stop the drive mechanism and generate an alarm signal.

As an alternative of the mechanism for stopping the drive mechanism, it is also effective to equip the drive mechanism itself, and an air-driven type mechanism will be effective for this purpose.

Figure 5:
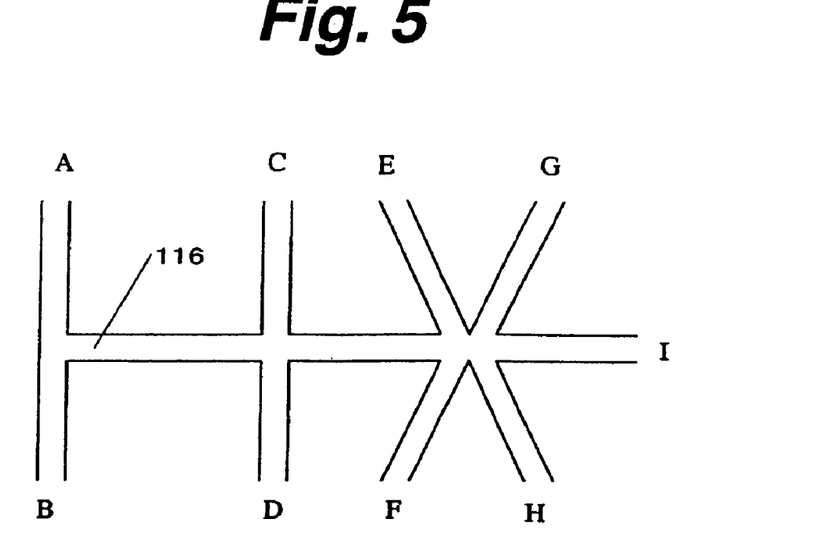
FIG. 5 is a schematic diagram showing a pipe system of a conventional chemical vapor deposition apparatus.

For MOCVD of III-V compound semiconductors, a plurality of source material gases are used. It has been acknowledged that confluence pipes must be properly arranged to bring source material gases controlled in flow rate into confluence with the main tube communicating with the reactor. For example, if two pipes merge to collide head-on with each other as shown in FIG. 5, then the gases from two pipes collide and interfere each other, vibrations produced thereby makes it impossible to property control the flow rate. Therefore, for bringing a plurality of pipes containing source material gases into confluence, it has been confirmed effective to employ a structure in which the pipes do not confront head-on, or the pipes merge at points offset by at least a distance corresponding to the diameter of the pipe.

The present invention has been made based upon the above-explained researches by the Inventor.

In an embodiment, the first aspect of the invention is a chemical vapor deposition apparatus that includes a gap that is provided along the boundary between a support base and the perimeter of a rotational susceptor supported on the support base.

To reliably prevent the bridging, the width of the gap along the boundary between the support base and the perimeter of the rotatable susceptor is preferably determined to be equal to or wider than about 0.5 mm, or more preferably determined to be equal to or wider than about 1 mm. On the other hand, if the gap is excessively wide, material gases will readily intrude in the gap and will accumulate on its sidewalls. Therefore, to prevent it, the width of the gap is preferably determined not to exceed about 3 mm, or more preferably determined not to exceed about 2 mm. Similarly, depth of the gap is preferably determined to be equal to or deeper than about 1 mm, or more preferably determined to be equal to or deeper than about 2 mm. On the other hand, depth of the gap is preferably determined to be shallower than or equal to about 4 mm, or more preferably determined to be shallower than or equal to about 3 mm.

The second aspect of the invention in an embodiment is a chemical vapor deposition apparatus including a support base, and a rotational susceptor attached to the support base with an inclination relative to the direction of gravity, wherein grooves of ridges and furrows are formed on the support base so that a decomposition product of a gas is accumulated in the grooves.

The third aspect of the invention in an embodiment is a chemical vapor deposition including; a support base; and a susceptor rotating mechanism including a bearing mechanism fixed to the support base and having a rotation transmission gear, and a susceptor fixed to one of rotating rotational members of the bearing to rotate therewith.

To incorporate a pair of opposed rotational members via balls, the bearing mechanism typically has a bearing structure in which the pair of rotational members are concentrically threaded so that, once both members are joined and relatively rotated beyond the threading engagement, the ridges of the threads function as disturbances against disengagement of the members and hold them integrally.

The fourth aspect of the invention in an embodiment is a chemical vapor deposition apparatus including a support base; and a susceptor rotating mechanism having a bearing mechanism fixed to the support base and a susceptor fixed to one of rotational members of the bearing to rotate therewith, wherein one of the opposed rotational members includes a mechanical portion for receiving wind pressure, and a mechanism for guiding a gas flow to the mechanical portion.

The fifth aspect of the invention in an embodiment is a chemical vapor deposition apparatus having an external heating means and a reaction chamber that are separate chambers separated by a partition plate, wherein a communication passage is provided near a gas discharge outlet to equalize the external heating means and the reaction chamber in pressure.

The sixth aspect of the invention in an embodiment is a chemical vapor deposition apparatus including a structural body having a rotation symmetry and not fixed in position of its center point; and a structure for keeping the position of the center point against isotropic deformation such as thermal expansion of the structural body.

To keep the position of the center point, a plurality of connection rods are provided to extend from a plurality of points on the member having the rotation symmetry in directions equally offset from the diametric directions, and connected to a member independent from the member having the rotation symmetry at equally distant positions from the member having the rotation symmetry.

The seventh aspect of the invention in an embodiment is a chemical vapor deposition apparatus including a rotary encoder as a mechanism for detaching a drive force upon extraordinary torque caused by a failure of a substrate rotting mechanism; a slip or deformable connector to cope with extraordinary torque, and a mechanism for stopping a driver depending upon a result of comparison between the rotation signal of the rotary encoder and the rotation signal of the driver.

The eighth aspect of the invention in an embodiment is a chemical vapor deposition including an air driver directly connected to a rotary shaft as a mechanism for detaching a drive force upon extraordinary torque caused by a failure of a substrate rotating mechanism so that the air driver slips upon generation of extraordinary torque.

The ninth aspect of the invention in an embodiment is a chemical vapor deposition includes that a plurality of pipes containing source material gases merge a unit pipe structure at positions preventing head-on collision of the pipes, or at positions distant by at least the diameter of the pipe.

The invention is suitable for application to metal organic chemical vapor deposition apparatus among various types of chemical vapor deposition apparatuses. Especially, it is suitable for use in growth of III-V nitride semiconductors containing a group III element such as gallium (Ga), aluminum (Al), boron (B) and indium (In), and a group V element, such as of nitrogen (N), phosphorus (P) and arsenic (As), and the like.

Additional features and advantages of the present invention are described in, and will be apparent from, the following Detailed Description of the Invention and the figures.

DETAILED DESCRIPTION OF THE INVENTION

The present invention generally relates to a chemical vapor deposition apparatus, particularly suitable for a metal organic chemical vapor deposition. Some embodiments of the invention will now be explained below in detail with reference to the drawings.

Figure 6:
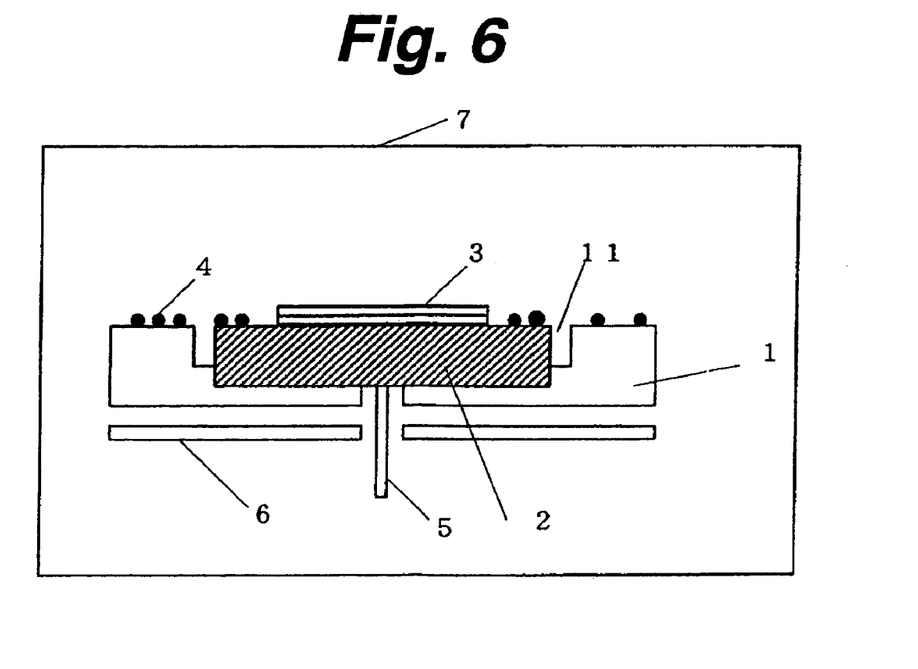
FIG. 6 is a cross-sectional view showing the substantial part of a chemical vapor deposition apparatus according to an embodiment of the present invention.

FIG. 6 shows configuration of a reactor in a chemical vapor deposition apparatus according to the first embodiment of the invention. In FIG. 6, reference numeral 1 denotes a support base made of a quarts material. Numeral 2 denotes a SiC-coated susceptor, and numeral 3 denotes a sapphire substrate. Numeral 5 denotes a rotary shaft for rotating the susceptor 2, 6 is a heater, and 7 is a reactor made of stainless steel. The process for crystal growth of GaN is explained below. First introduced is hydrogen gas into the reactor 7. Then, the reactor 7 is heated to about 1100° C. for about 15 minutes to clean the surface of the sapphire substrate. Then, the temperature is lowered to about 550° C., and ammonia and trimethyl gallium (TMG) is supplied to deposit amorphous GaN up to a thickness around 30 nm. Thereafter, the supply of TMG is interrupted, and while ammonia and hydrogen are supplied, the temperature is raised to about 1100° C. to crystallize GaN accumulated under a low temperature. Subsequently, TMG is again supplied to accumulate single crystal GaN on the micro seed crystals. The process of these sequential steps is known.

After completion of the crystal growth, the substrate is removed, and a new sapphire substrate is set on the same position for the next growth round. The condition at the start of the second growth round is different from that of the initial growth round in that GaN exists around the susceptor 2 or on the support base 1. This GaN sediment decomposes in hydrogen in the process of cleaning the substrate surface as the first step of the second growth round because of a high temperature, and makes micro metal droplets of Ga. The sediment is shown at 4 in FIG. 1. FIG. 1 shows configuration of the susceptor and its peripheral members in a conventional chemical vapor deposition apparatus. The rotational susceptor 2 and the support base 1 are typically formed not to interpose a gap within the extent of the current machining accuracy. Actually, however, there inevitably exists the gap of approximately 0.1 mm. Metallic gallium produced may exist above the gap, i.e. along the boundary between the susceptor 2 and the support base 1, and it appeared to intrude into the gap experientially. Although its mechanism is not clear, it will be possible to suppose that micro droplets join and become a certain size, and intrude into the gap by surface tension. This is shown at 41 in FIG. 4.

In the next process of supplying ammonia to form gallium nitride, the Ga metal is nitridized by ammonia, and again forms GaN. Responsively, simultaneously with the solidification, it expands in volume and produces a strong frictional force that disturbs rotation. Ultimately, it may lead to destruction of the mechanisms. In view of such experiential phenomenon, the first embodiment of the invention adds an improvement as shown in FIG. 6. That is, against the common knowledge of sizing them not to produce a substantial space between them, the embodiment makes a space around 1 mm or more between them, and the gap is dug down to a depth equal to or deeper than 2 mm. This is shown at 11 in FIG. 6. In this configuration, even when the GaN accumulated on the support base 1 changes to Ga metal, it does not form bridges to the susceptor 2, and therefore do not intrude into the gap 11. The amount of deposition on sidewalls of the gap 11 was small because the source material gases do not reach there. Therefore, the susceptor 2 could be used for much more rounds of crystal growth before it needs replacement, and the productivity was enhanced accordingly.

Figure 7:
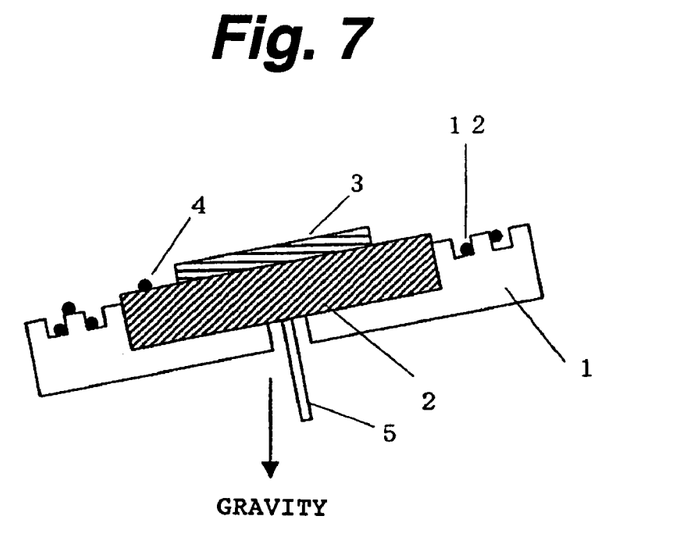
FIG. 7 is a cross-sectional view showing the substantial part of a chemical vapor deposition apparatus according to an embodiment of the present invention.

In a lateral type apparatus in which source material gases are introduced horizontally and flow in parallel with the substrate, the susceptor is inclined by raising the downstream side thereof for the purpose of uniforming the growth thickness of the film. In case of growth of III-V nitride semiconductors, bridging over the boundary between the susceptor 2 and the support base 1 by gallium metal becomes more serious because droplets of gallium slip down the slope. To improve the apparatus in this respect, the second embodiment of the invention employs the improvement shown in FIG. 7. That is, the support base 1 has formed grooves 12 of ridges and furrows. Thus, gallium metal drops in the grooves 12, or downward flows of the gallium metal are interrupted by the grooves 12. Therefore, gallium metal is unlikely to accumulate between the susceptor 2 and the support base 1. As a result, the apparatus could be used for much more rounds of the growth process, and the productivity thereof was enhanced.

Figure 8:
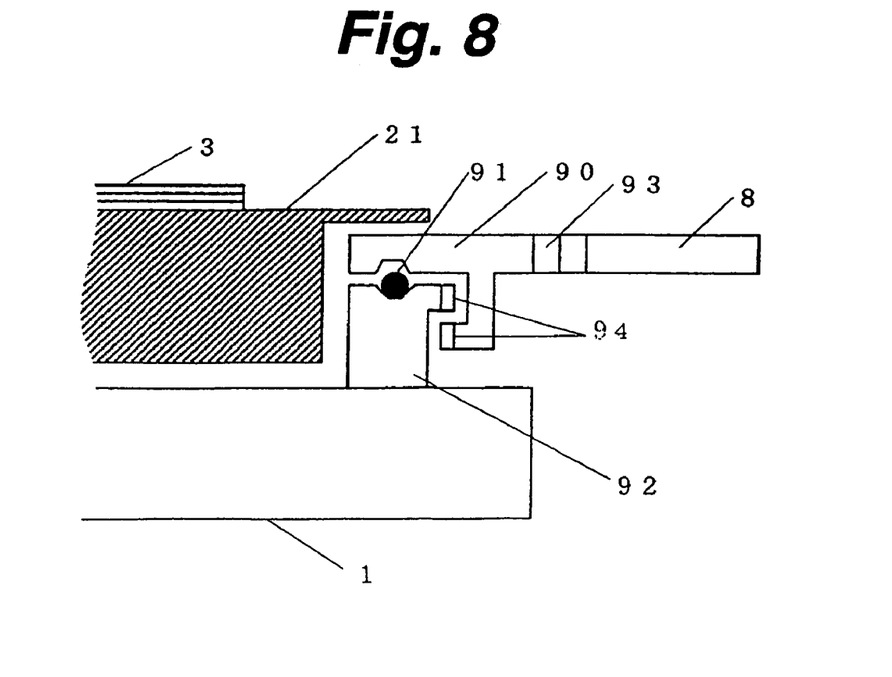
FIG. 8 is a cross-sectional view showing the substantial part of a chemical vapor deposition apparatus according to an embodiment of the present invention.

FIG. 2 shows one of known techniques for rotating the substrate. The support base 1 and the susceptors 21 have formed annular grooves, and a plurality of carbon balls 91 are held in the grooves to support the susceptors rotationally. For transmission of the rotational force, a gear 93 is formed at an end of each susceptor 21 and engages with an external stationary gear 8. When the rotary shaft 5 rotates the support base 1, the susceptors 21 rotate about their own axes. Although this is an excellent mechanism, it is insufficient depending upon its materials. In case the apparatus is intended for growth of GaN, for example, which needs a high growth temperature, the support base 1 and the susceptors 21 are made of SiC or SiC-coated carbon. These are very hard materials, and the machining accuracy and the surface condition of the grooves and the gears are worse than those made of carbon. Moreover, since sapphire balls are used instead of carbon balls 91, the apparatus is insufficient in lubricity, and a larger frictional force is produced during rotation. As the rotating speed increases, large vibrations will occur. In extreme cases, disharmony occurs among rotatable members, the susceptors 21 will accidentally disengage eventually. Therefore, for growth of GaN compound semiconductors, the apparatus needs a structure reliably preventing accidental disengagement. It has been confirmed that this problem can be overcome by inserting an independent bearing mechanism between the support base 1 and the susceptors 2. FIG. 8 shows the third embodiment of the invention directed to this improvement. Here is shown only a part thereof necessary for explanation of this system. In FIG. 8, numeral 21 refers to a susceptor, and 90, 91 and 92 denote components of the bearing, which are made of SIC or nitride-based new ceramics. Numeral 93 denotes a gear formed on one of complementary members of the bearing, which is connected to the external stationary gear 8. The mechanism incorporating the bearing mechanism and preventing accidental disengagement upon vibrations is realized by male and female screws 94. For assembling the mechanism, sapphire balls 91 are first put in the groove of the other complementary member 92 of the bearing fixed to the support base 1, and the other rotational member 90 is next put thereon and rotated to fasten the screws 94. Thus, the members 90 and 92 engage deeper and deeper beyond the engagement of the screws 94, and become free as illustrated. Thereafter, the complementary members of the bearing do not disengage unless the upper member is lifted against the gravity and rotated oppositely. A gear 93 is associated with the bearing, and rotates under engagement with the external fixed gear 8. Other than the above-explained mechanism, there are various types of mechanisms for incorporating the bearing. If a retainer is used to reduce interference between balls, more stable rotation will be ensured.

Figure 9:
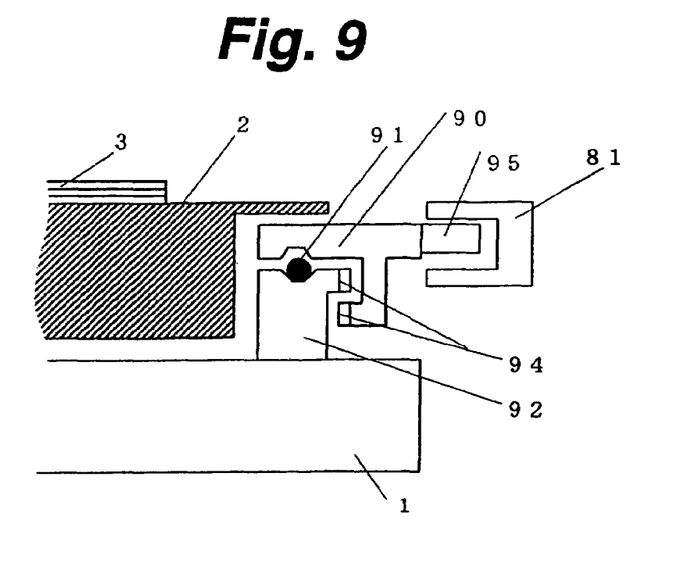
FIG. 9 is a cross-sectional view showing the substantial part of a chemical vapor deposition apparatus according to an embodiment of the present invention.

FIG. 9 shows a chemical vapor deposition apparatus according to the fourth embodiment of the invention. Here is shown another example related to the way of rotating the bearing shown in FIG. 8. In FIG. 9, numeral 95 denotes a wind pressure receiver that receives a wind pressure from a gas inlet 81 and converts the energy to a rotating force for the bearing. This mechanism is advantageous in releasing extraordinary resistance to the bearing by slipping and being thereby freed from destruction.

Figure 10:
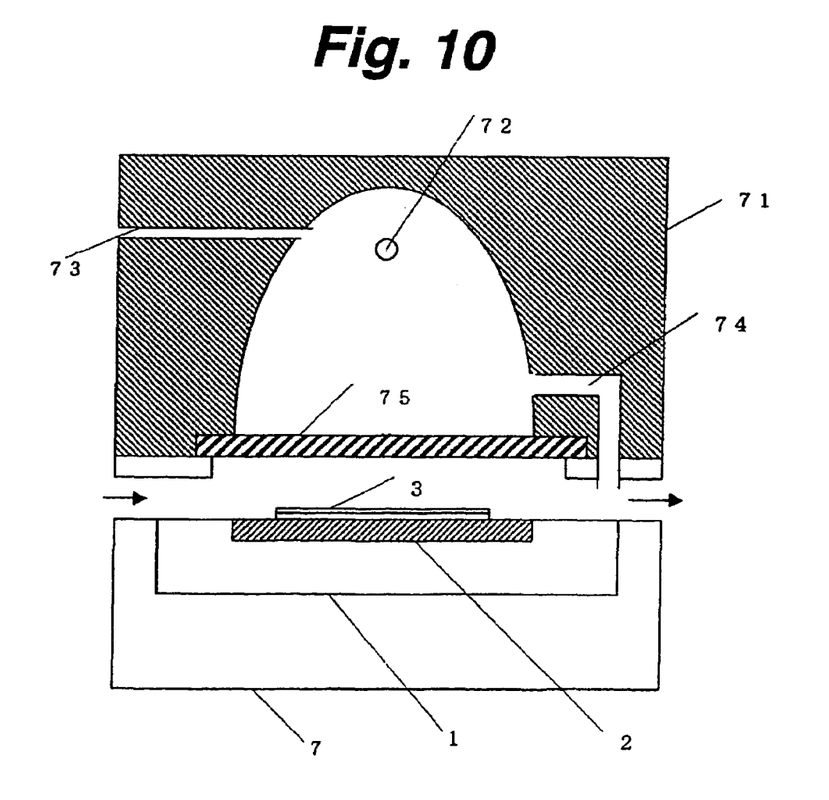
FIG. 10 is a cross-sectional view showing the substantial part of a chemical vapor deposition apparatus according to an embodiment of the present invention.

FIG. 10 shows a chemical vapor deposition apparatus according to the fifth embodiment of the invention, which employs lamp-aided heating from above as a heating means. In FIG. 10, numeral 71 denotes a lamp house that is an integral part of the pressure container. Numeral 72 denotes a halogen lamp, 73 is a cooling gas inlet path for cooling the lamp, 74 is a pressure through path opening to a downstream position of the reactor, and 75 is a partitioning plate for separating the gas flow-in path from the lamp portion. The partitioning plate 75 is a transparent quartz plate having a thickness of about 5 mm to about 10 mm. Since the pressure through path 74 merges the exhaust gas, the exhaust gas may accidentally flow back toward the lamp upon a change in reaction pressure. To prevent it, inactive gas for the cooling purpose is continuously supplied from the cooling gas inlet path 73. Since the pressure through path 74 renders the lamp side and the substrate side approximately equal in air pressure, the partitioning plate 75 may be thin. This configuration makes it possible to employ the lamp-aided heating method under a reduced pressure.

FIG. 3 shows a system for rotating a large-sized donut-shaped rotational susceptor 2 supported on the circumferential surface of the support base 1 and rotated when the support base 1 rotates. The donut-type susceptor 2 is employed in apparatuses configured to blow out source material gases from the center in radial directions. The support base 1 is typically made of quartz, and the donut-type susceptor 2 is SiC-coated carbon. The support base 1 is not heated, but the susceptor 2 is heated to 1100° C. for example. Therefore, these members cannot be fixed, and the susceptor 2 is supported only by contact with the circumferential surface of the support base 1. Alternatively, a guide in the radial direction may be provided, but the susceptor 2 cannot be united with the support base 1. Therefore, thermal expansion and contraction in repetitive heating and cooling cause a deviation of the center position of the susceptor 2. To prevent the positional deviation, the sixth embodiment of the invention connects them with quartz connection rods 100. The connection rods 100 each have fixed points on the support base 1 and on the susceptor 2. The line connecting the fixed points of each connection rod 100 is offset from the diametric line passing the fixed point on the support base 1 by a certain angle, such as 45 degrees. In operation, when the donut-type susceptor 2 expand due to a rise of the temperature, the inner diameter of the susceptor 2 also expands. Then, in case of FIG. 3, each connection rod 100 rotates the susceptor 2 in a direction reducing the angle from the diametric direction, making use of the expansion force of the susceptor 2. Thus, the donut-type susceptor 2 can keep the center point upon isotropic deformation thereof.

FIG. 4 shows a chemical vapor deposition apparatus according to the seventh embodiment of the invention, taken as another example that must expand and contract while keeping the center position. In FIG. 4, numeral 21 denotes a susceptor set in a bearing mechanism. Numeral 8 denotes an external stationary gear. Numeral 93 denotes cogs of the gear 90 in engagement of the cogs of the external stationary gear 8. In operation, when the support base 1 rotates about its center point, the susceptor 21 set on the bearing mechanism is rotated about its own center and together with the support base 1 by engagement of the cogs 93 of the gear 90. When the temperature rises, both the support base 1 and the external stationary gear 8 expand by thermal expansion. If the external stationary gear 8 expands under no restriction, i.e. under no means keeping the center point, the engagement becomes tight on one hand and loose on the other hand. Such uniform gear engagement invites collision of cogs and destruction thereof. The connection rods 100, however, assures smooth rotation by permitting the stationary gear 8 to expand while keeping the center point by the same principle.

Figure 11:
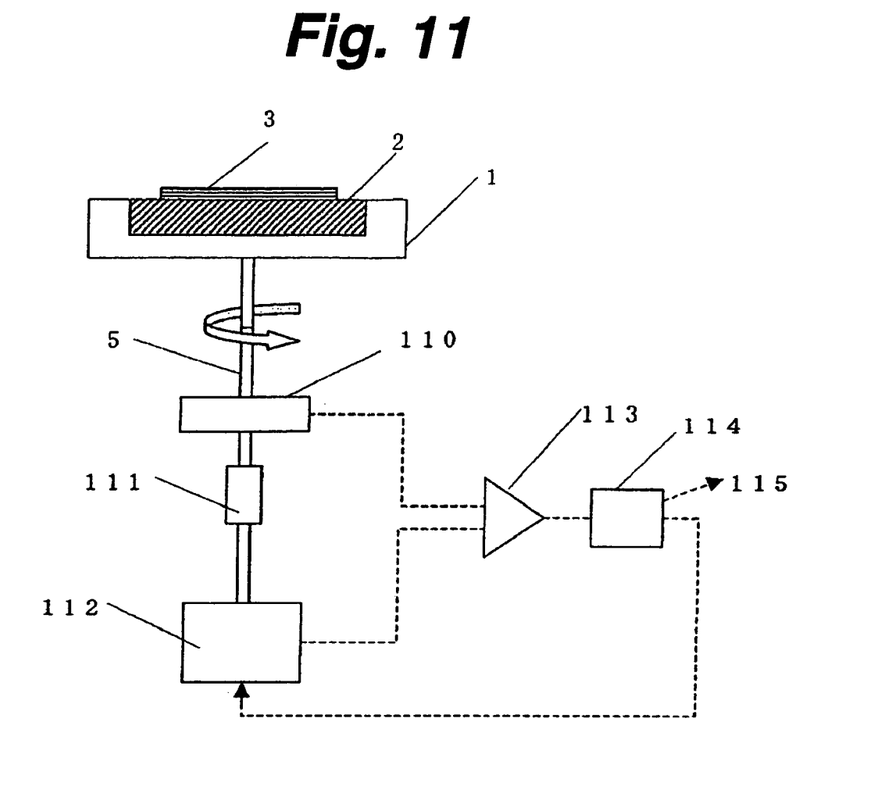
FIG. 11 is a schematic diagram showing the substantial part of a chemical vapor deposition apparatus according to an embodiment of the present invention.

Regarding countermeasures against extraordinary rotation, almost no techniques have been taught. FIG. 11 shows a chemical vapor deposition according to the eighth embodiment of the invention, improved in the power transmission system of the rotating system to cope with irregular operation of the apparatus. In FIG. 11, numeral 110 denotes a rotary encoder, numeral 111 denotes a connector slidable or torsionally deformable under large torque, and numeral 112 denotes a driver such as a stepping motor. Numeral 113 is a comparator of electrical signals, and numeral 114 is an information processing device. This system operates as explained below. Let an extraordinary torque be caused by an irregularity occur in the rotating system of the support base 1. Once the connector 111 slips or twists, rotation signals from the rotary encoder 110 and rotation signals from the driver 112 disagree. The comparator 113 detects the disagreement, converts it to a digital signal, and delivers it to the information processing device 114. Responsively, the information processing device 114 analyzes the irregularity, interrupts the driver 112 and generates an alarm signal 115. In this manner, destruction of the reactor can be prevented.

Figure 12:
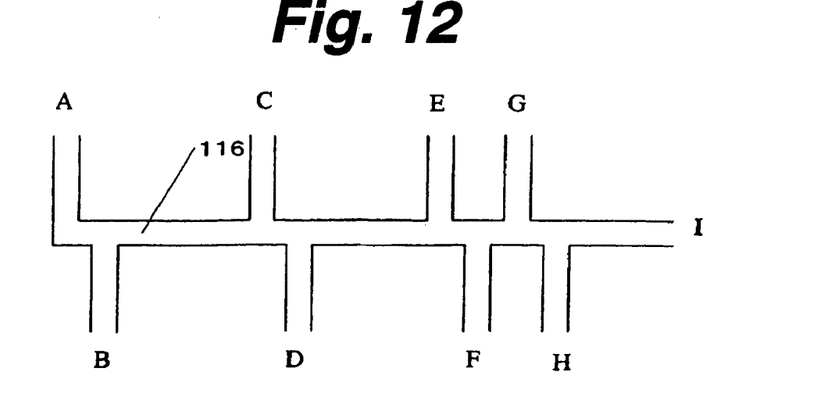
FIG. 12 is a pipe system in a chemical vapor deposition apparatus according to an embodiment of the present invention.

As the pipe arrangement for supplying source material gases to the reactor, chemical vapor deposition apparatuses typically let carrier gas flow in the main pipe, and connect source material gas pipes to the main pipe. FIG. 5 shows a conventional layout of pipes. For example, 116 denotes the main pipe that is connected to the reactor at position I. In FIG. 5, the main pipe is labeled A, and source materials gas pipes are labeled B through H. The portion of A, B is the pipe arrangement of a unit for one source material, the portion of C, D is that for two source materials, and the portion of E through H is that for four source materials. Typically, source material gas pipes are gathered and connected substantially at one point as shown in FIG. 5 because, if the main pipe has a large pipe resistance, the pressure will differ among different positions of the pipe system, and will cause undesirable problems upon switching gases. However, this arrangement of pipes has been confirmed through actual use thereof to involve the problem explained below. That is, when the flow rate of source materials gases increases, vibrations occurred in the flows of source materials gases. This is because that the gas pressure from one of opposed pipes, C, influences the other of the opposed pipes, D; the flow rate controller (mass flow controller, MFC) of the pipe D gives a feedback control; its result influences the control of the counter part pipe C; and repetition of this cycle causes vibrations or chaotic behaviors of the gas flows. The vibrations can be controlled to a certain extent by adjusting the time constant of the flow rate controllers. However, it has been confirmed that the phenomenon of vibrations can be essentially removed by using the pipe arrangement shown in FIG. 12 that illustrates the ninth embodiment of the invention. That is, it is important that a plurality of pipes to be joined do not meet head-on, or their merging points are distant from each other by a distance with which the change in pressure by entrance of each gas is reduced to a negligible level. From this point of view, it has been confirmed that nearest two merging points of pipes should be distant at least by the interval equal to or more than the pipe diameter.

Heretofore, some specific embodiments of the invention have been explained. However, the invention is not limited to these embodiments, but contemplates other various modifications based upon the technical concept of the present invention. For example, the first embodiment shown in FIG. 6 can be extended to a system intended for processing a plurality of substrates simultaneously. Further, although those embodiments have been explained as being of a face-up type, they can be modified to a face-down type. The concept of keeping the center point by the use of connection rods 100 is also usable for holding the bearing mechanism in the apparatus, for example. Moreover, it is applicable to all mechanisms having difficulties in fixing the center point.

As described above, according to the first aspect of the invention in an embodiment, since the gap is provided between the rotational susceptor and the support base, the apparatus is freed from disturbance of rotation caused by bridging of these members by deposits, and is operative for more rounds of crystal growth process. Thus, the manufacturing capability by the apparatus is enhanced.

According to the second aspect of the invention in an embodiment, grooves by ridges and furrows on the support base removes disturbance of rotation caused by undesirable flows of deposits to the boundary with the susceptor even in inclined reactor devices. Here again, the apparatus is operative for more rounds of crystal growth process, and enhanced in manufacturing capability.

According to the third and fourth aspects of the invention in an embodiment, the use of the independent, new bearing mechanism in the rotation system ensures stable rotation of the substrate, enhances the production yield and improves the manufacturing capability.

According to the fifth aspect of the invention in an embodiment, the use of the pressure through path in the lamp-aided heating type apparatus makes it possible to employ the lamp-aided heating also in pressure-reduced systems to manufacture substrates with high-quality films grown thereon.

According to the sixth aspect of the invention in an embodiment, in a system including members subjected to isotropic deformation such as thermal expansion, center positions of those members can be kept constant to ensure their stable rotational movements and enhance the capability of the apparatus.

According to the seventh aspect of the invention in an embodiment using a combination of the rotary encoder and the connector that can slip or twist, it is possible to stop the driver immediately upon any irregular rotation and generate an alarm signal to prevent any damage to the apparatus.

According to the eighth aspect of the invention in an embodiment including the air-aided driver directly connected to the rotary shaft, it is possible to stop the driver immediately upon any irregular rotation to prevent any damage to the apparatus.

According to the ninth aspect of the invention in an embodiment employing the pipe arrangement for chemical vapor deposition apparatuses in which source material gas pipes do not meet head-on when they merge, high-quality crystal growth is possible without vibrations by gas flows.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A chemical vapor deposition apparatus comprising:
    a donut-shaped carbon susceptor supported on a quartz central support base and rotated when the support base rotates, having a rotational symmetry and not fixed in position of its center point; and
    a plurality of connection rods made of quartz for maintaining a position of a center point against isotropic deformation of the susceptor, provided to extend from a plurality of points on the susceptor in directions equally offset from a diametric direction, and connected to the support base at equally distant positions from the susceptor, each of the connection rods having a fixed point on the support base and the susceptor, respectively,
    each of the connection rods rotating the susceptor in a direction reducing an angle from the diametric direction, making use of an expansion force of the susceptor, when the susceptor expands due to an increase in temperature.

2. The chemical vapor deposition apparatus according to claim 1, wherein the apparatus includes a metal organic chemical vapor deposition apparatus.

* * * * *